United States Patent
Moriyama et al.

(10) Patent No.: US 7,842,982 B2
(45) Date of Patent: Nov. 30, 2010

(54) SEMICONDUCTOR DEVICE AND MANUFACTURING METHOD THEREOF

(75) Inventors: Yoshihiko Moriyama, Tokyo (JP); Naoharu Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 12/361,002

(22) Filed: Jan. 28, 2009

(65) Prior Publication Data

US 2009/0189199 A1    Jul. 30, 2009

(30) Foreign Application Priority Data

Jan. 29, 2008    (JP)    ............................. 2008-018106

(51) Int. Cl.
*H01L 29/04* (2006.01)
(52) U.S. Cl. .................. 257/255; 257/347; 257/351; 257/E29.004
(58) Field of Classification Search ................. 257/255, 257/347, 351, E29.004
See application file for complete search history.

(56) References Cited

U.S. PATENT DOCUMENTS

2008/0135886 A1    6/2008    Irisawa et al. ............... 257/255

FOREIGN PATENT DOCUMENTS

| JP | 2000-0286418 A | 10/2000 |
|---|---|---|
| JP | 2005-039171 | 2/2005 |
| JP | 2005-526385 | 9/2005 |
| JP | 2006-191109 | 7/2006 |
| JP | 2007-515808 | 6/2007 |
| JP | 2007-329474 | 12/2007 |
| JP | 2008-147366 | 6/2008 |
| WO | 2006/125040 A3 | 11/2006 |

OTHER PUBLICATIONS

Uchida, et al., "*Carrier Transport in (110) nMOSFETs: Subband Structures, Non-Parabolicity, Mobility Characteristics, and Uniaxial Stress Engineering*"; Aug. 2006, IEEE, 3 pages.

(Continued)

*Primary Examiner*—Cuong Q Nguyen
*Assistant Examiner*—Trang Q Tran
(74) *Attorney, Agent, or Firm*—Ohlandt, Greeley, Ruggiero & Perle, L.L.P.

(57) ABSTRACT

A semiconductor device includes a semiconductor substrate having, on a surface thereof, a (110) surface of $Si_{1-x}Ge_x$ ($0.25 \leq x \leq 0.90$), and n-channel and p-channel MISFETs formed on the (110) surface, each MISFET having a source region, a channel region and a drain region. Each MISFET has a linear active region which is longer in a [−110] direction than in a [001] direction and which has a facet of a (311) or (111) surface, the source region, the channel region and the drain region are formed in this order or in reverse order in the [−110] direction of the linear active region, the channel region of the n-channel MISFET is formed of Si and having uniaxial tensile strain in the [−110] direction, and the channel region of the p-channel MISFET being formed of $Si_{1-y}Ge_y$ ($x<y\leq1$) and having uniaxial compressive strain in the [−110] direction.

3 Claims, 17 Drawing Sheets

OTHER PUBLICATIONS

Irisawa, et al., "*Electron Transport Properties of Ultrathin-body and Tri-gate SOI nMOSFETs with Biaxial and Uniaxial Strain*"; Aug. 2006, IEEE, 4 pages.

Irisawa, et al., "*High Performance Multi-Gate pMOSFET's using Uniaxially-Strained SGOI Channels*", Aug. 2005, IEEE, 4 pages.

Search Report (with English translation) dated Mar. 16, 2010 from corresponding Japanese Application No. 2008-018106.

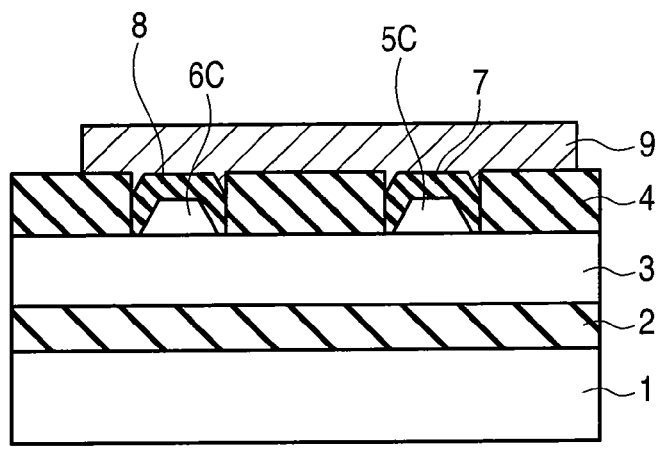
F I G. 1A
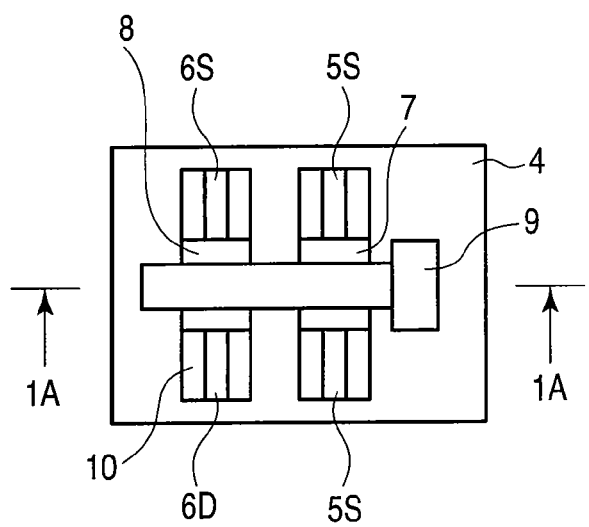
F I G. 1B
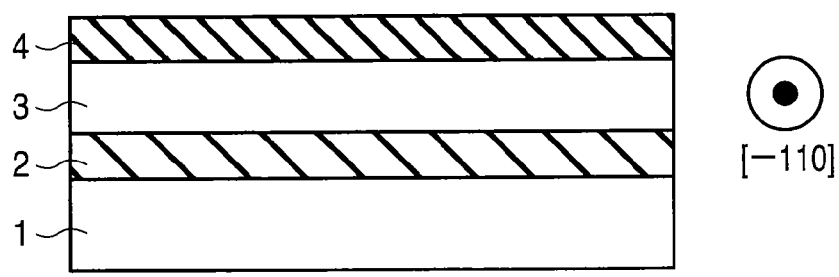
F I G. 2

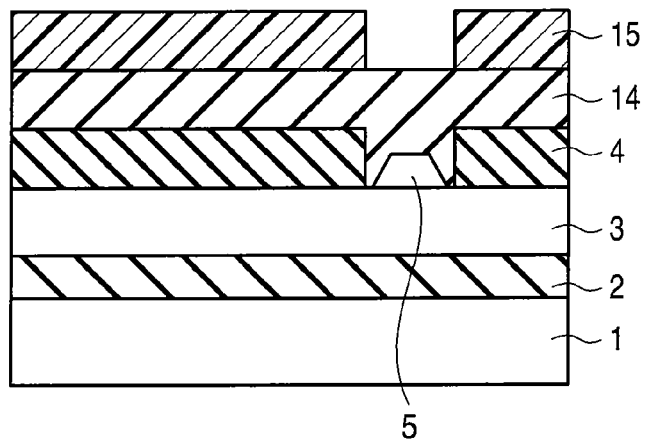
FIG. 6
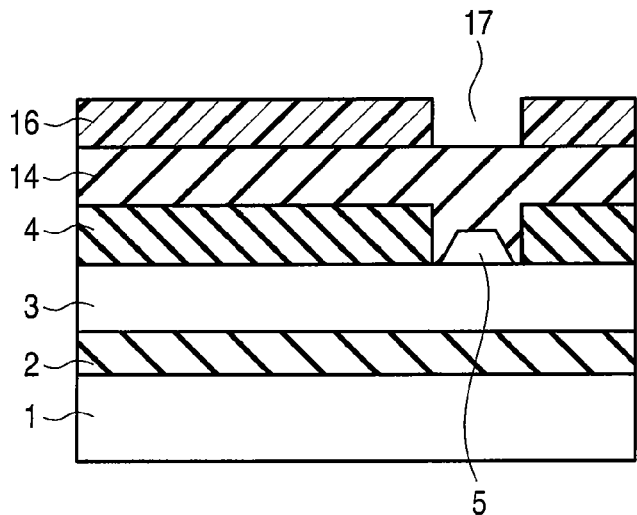 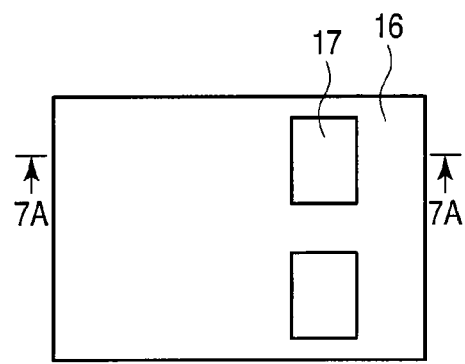
FIG. 7A   FIG. 7B
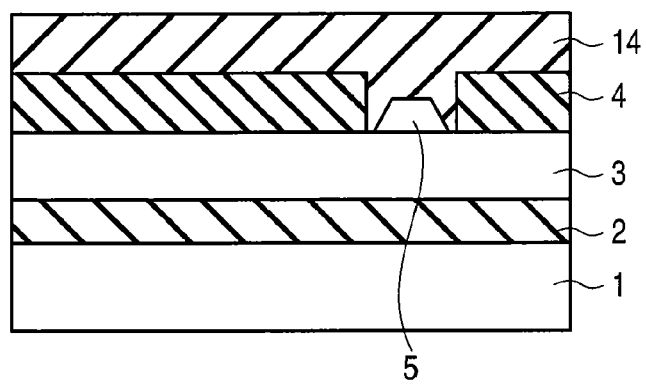
FIG. 8

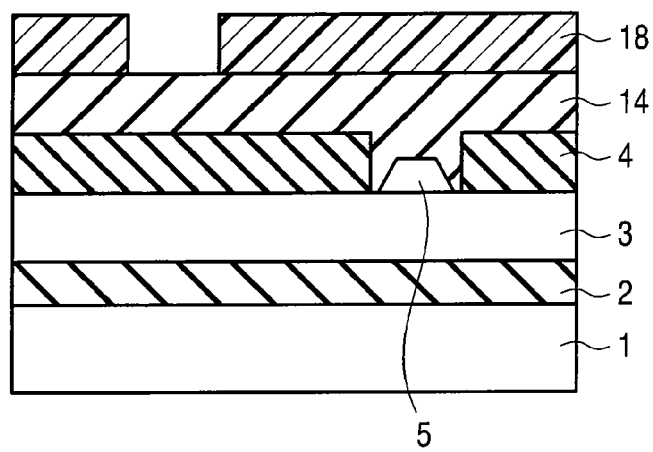
F I G. 9
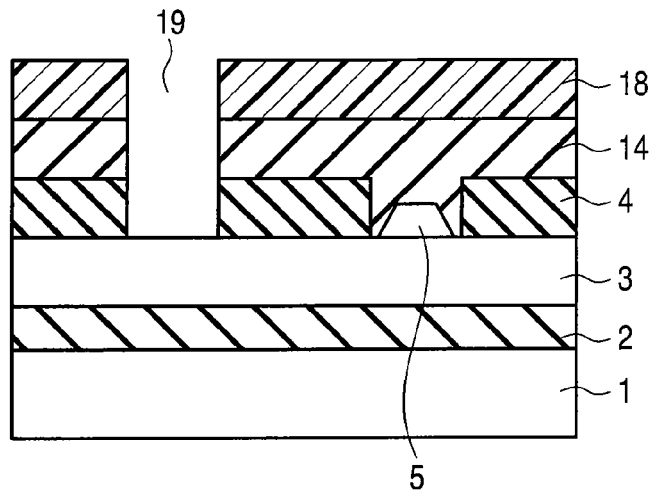
F I G. 10
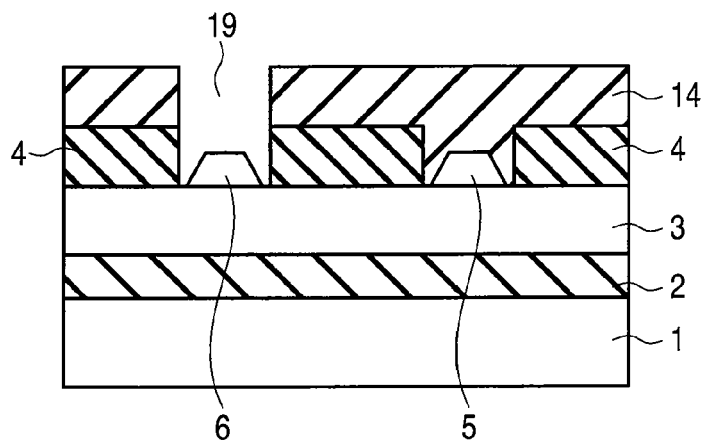
F I G. 11

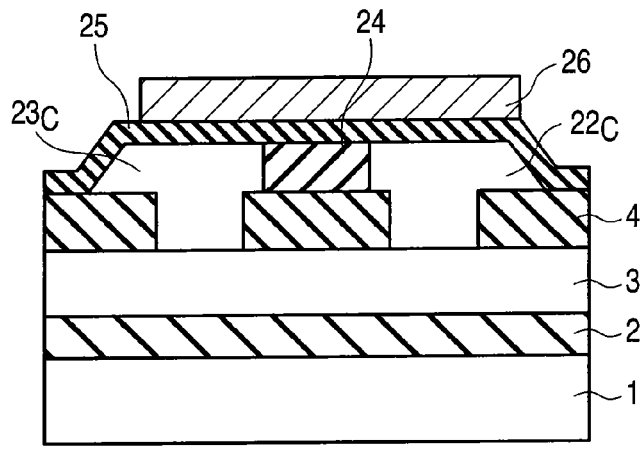
FIG. 17A
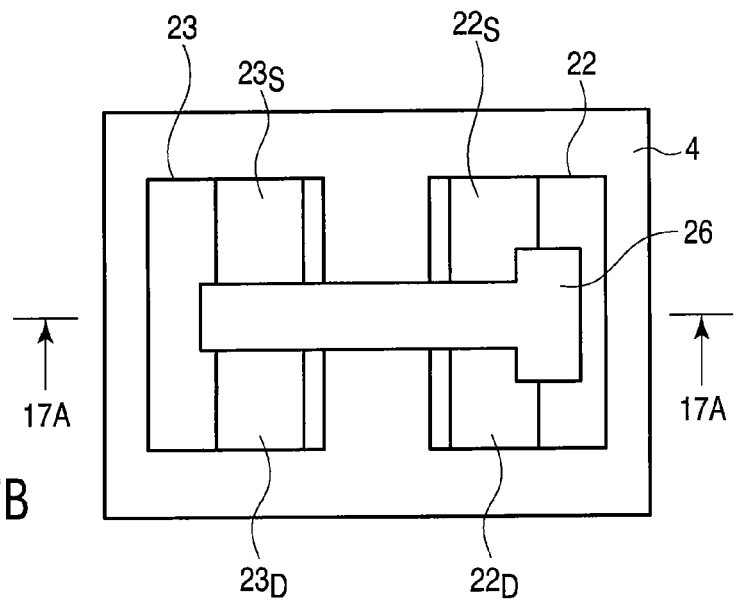
FIG. 17B
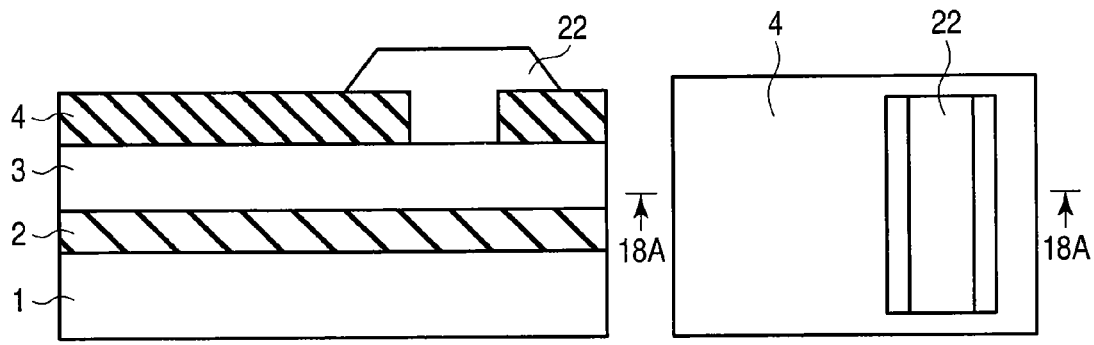
FIG. 18A
FIG. 18B

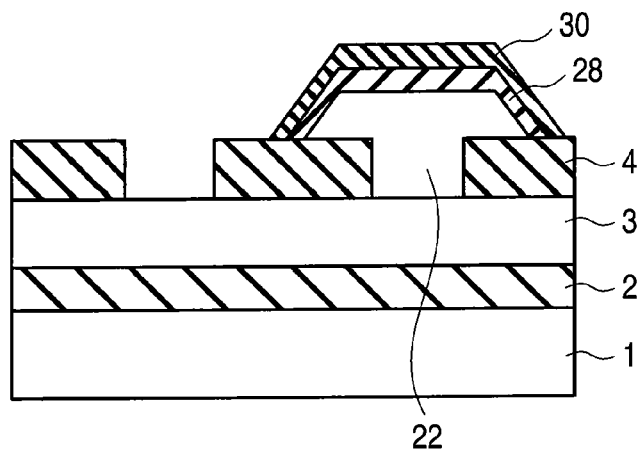
F I G. 25
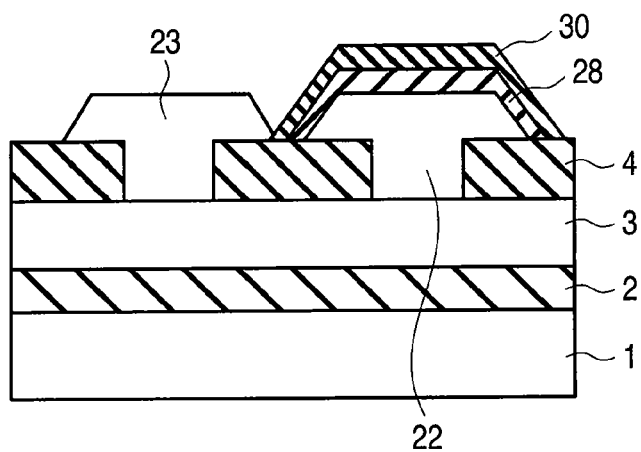
F I G. 26
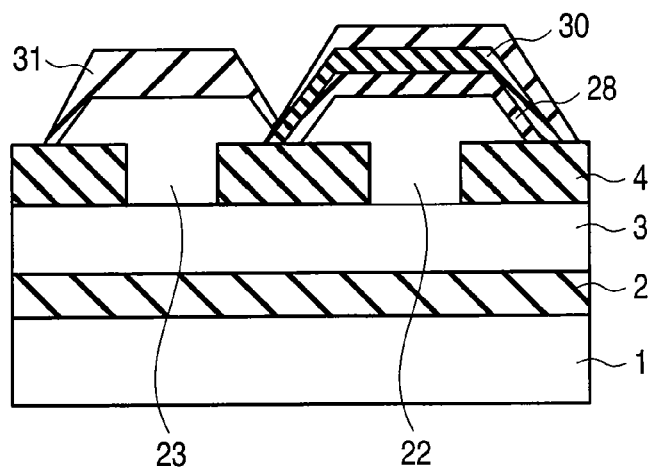
F I G. 27

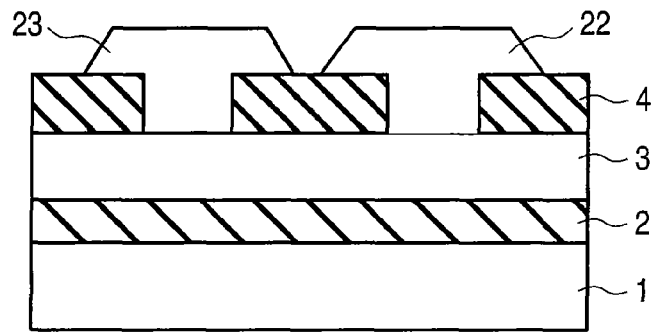
F I G. 28
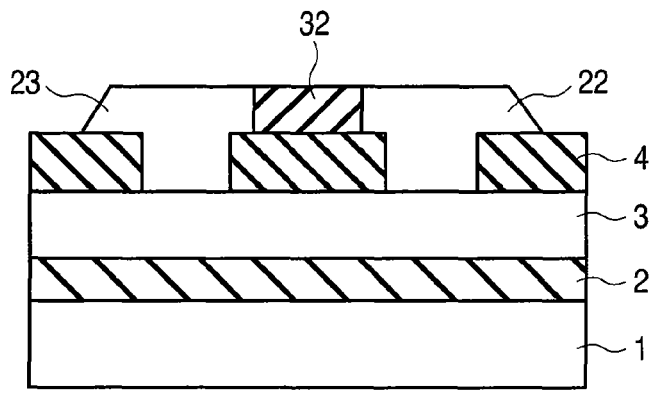
F I G. 29
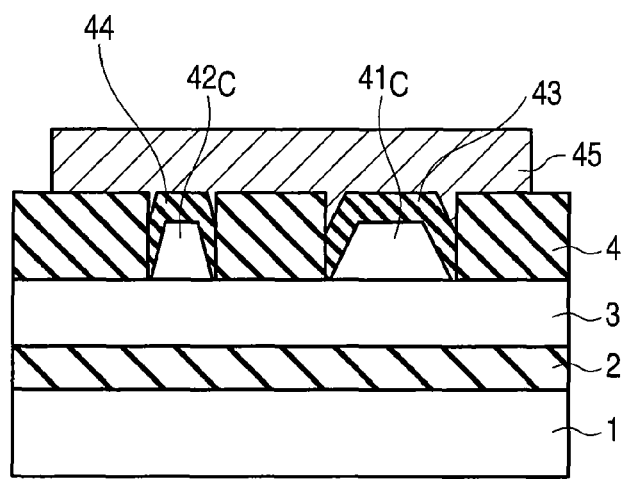
F I G. 30A

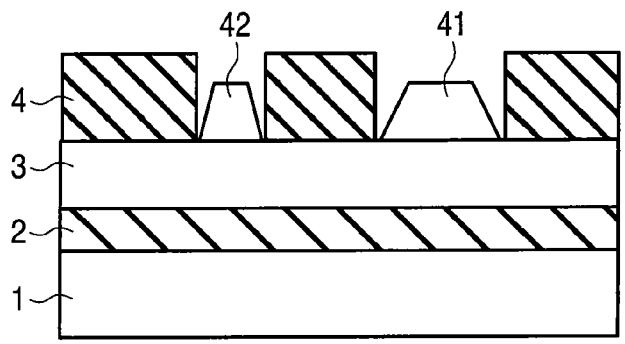
F I G. 33A
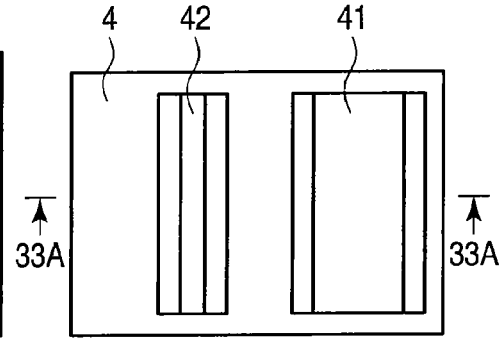
F I G. 33B
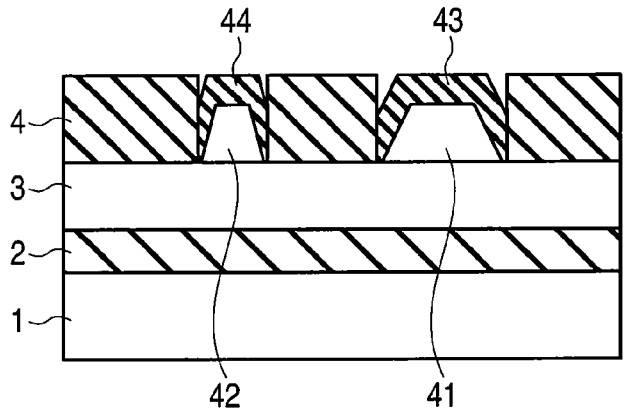
F I G. 34A
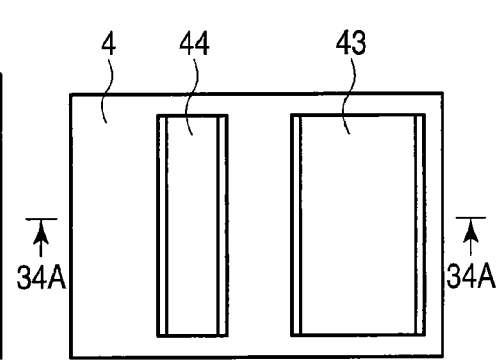
F I G. 34B
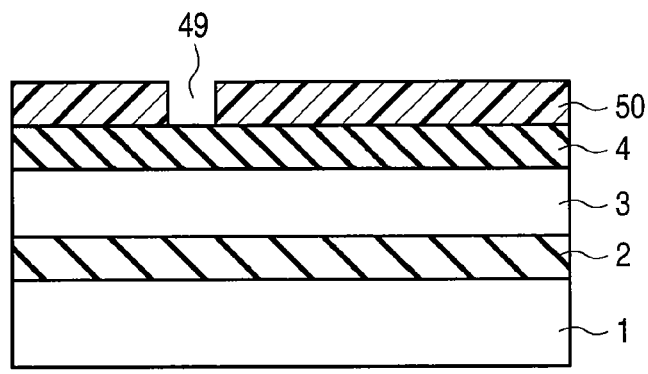
F I G. 35

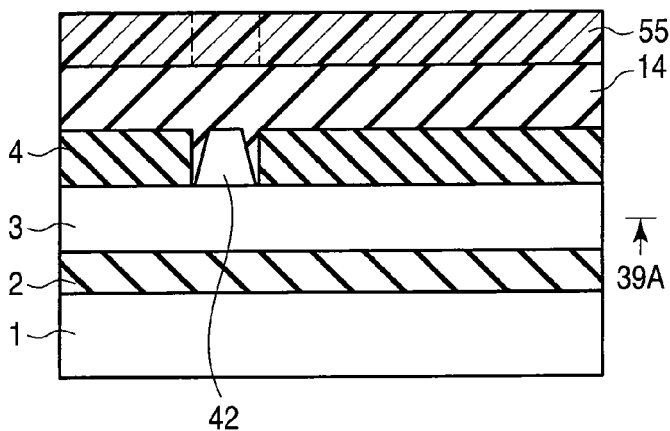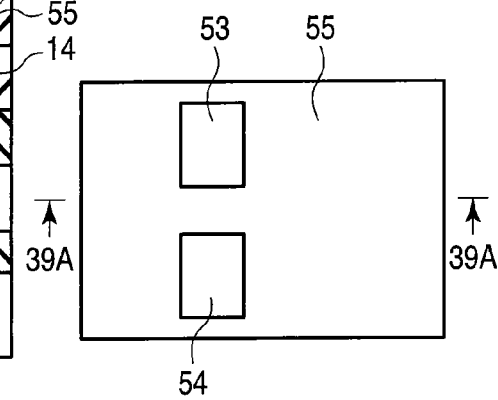
F I G. 39A  F I G. 39B
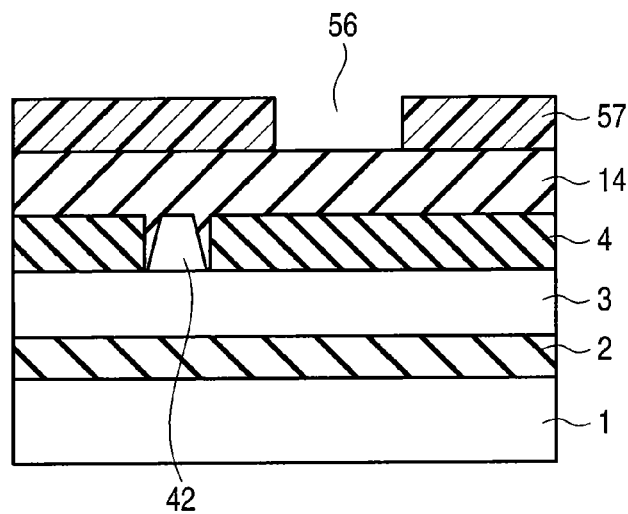
F I G. 40
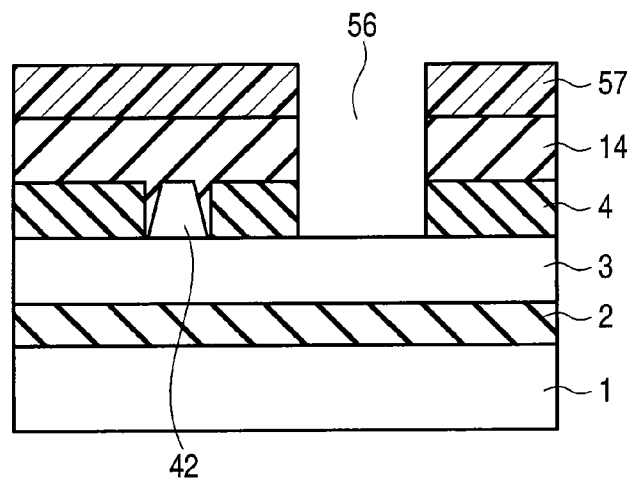
F I G. 41

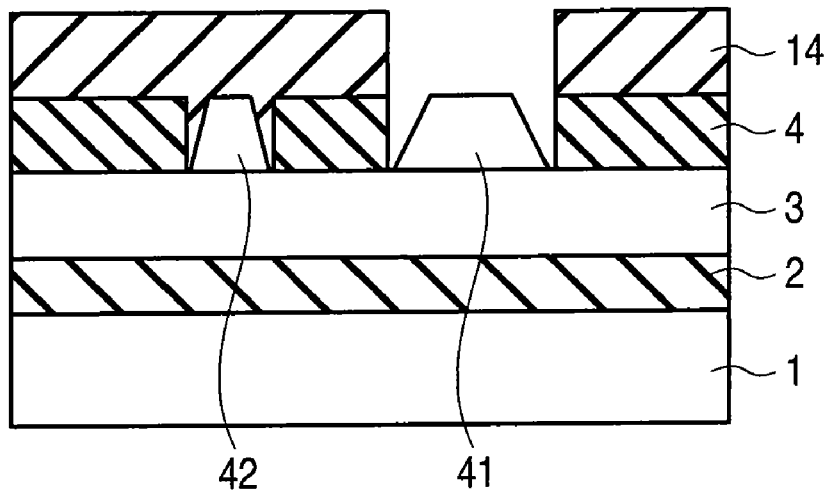
F I G. 42
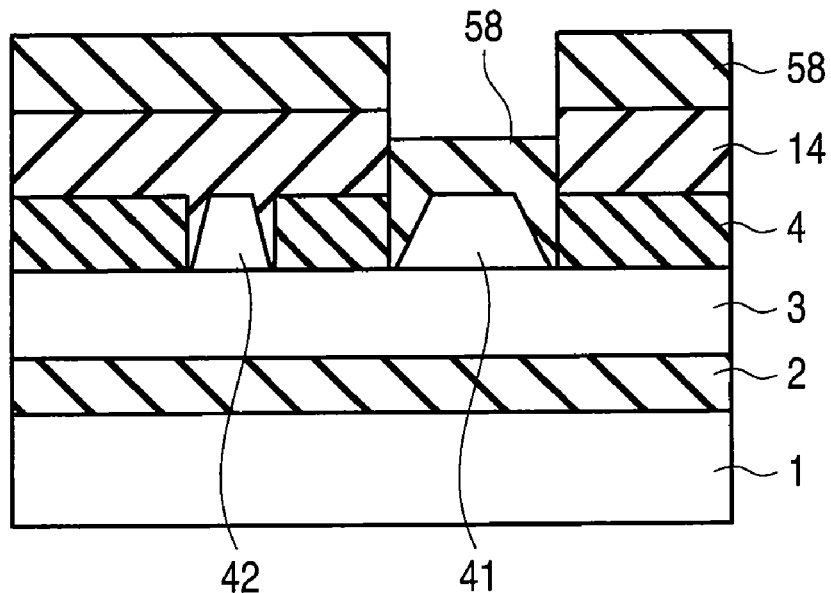
F I G. 43

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2008-018106, filed Jan. 29, 2008, the entire contents of which are incorporated herein by reference.

BACKGROUND OF THE INVENTION

1. Field of the Invention

Exemplary embodiments described herein relates to a MISFET which is formed on a (110) surface of an SiGe layer and which has a current direction in a <−110> direction and which has uniaxial strain.

2. Description of the Related Art

There have heretofore been proposed micro metal insulator semiconductor field effect transistors (MISFETs) with high drive current as follows: a fine-wire form MISFET using, as channels, Si, Ge and SiGe that are formed on an Si (100) substrate by an oxidation or etching process; and a FinMISFET.

One example is a pMOSFET (e.g., refer to T. Irisawa; IEDM 2005, p. 457) wherein a (100) surface of a totally strained silicon-germanium-on-insulator (SGOI) layer produced by a Germanium condensation technique is mesa-processed into a Fin form long in a <110> direction, and a (110) surface of the side surface of the Fin is used as a uniaxial strain channel. Another example is a uniaxial strain channel MOSFET (e.g., refer to T. Irisawa; IEDM 2006, p. 725) wherein a (100) surface of a strained-silicon-on-insulator (SSOI) substrate is used and thus Fin-processed to be long in a <110> direction.

In the above-mentioned examples, a Fin structure is produced on the (100) surface of the substrate, and in the process of this production, elastic uniaxial stress relaxation is used to obtain the uniaxial strain channel. It is thus difficult to produce MISFETs for both p and n on the same substrate and construct a complementary MISFET.

JP-A 2007-515808 (KOHYO) has also proposed a CMOS-FET wherein a bulk strain-relaxed SiGe stacked substrate is formed on a bulk Si substrate, on which there are an Si-nMOS region having biaxial tensile strain and an SiGe or Ge-pMOS region having biaxial compressive strain. However, this JP-A publication shows no descriptions of uniaxial strain and the shape of a channel and no particular specification of surface orientation.

JP-A 2000-286418 (KOKAI) has also proposed a CMOS-FET wherein there are an Si-nMOS region having biaxial tensile strain and an SiGe or Ge-pMOS region having biaxial compressive strain on an SGOI or on a bulk strain-relaxed SiGe stacked substrate. However, this publication shows no descriptions of uniaxial strain and the shape of a channel either.

When channel directions are taken in a [−110] direction with high mobility in both p- and n-channel MISFETs, it is difficult to achieve high mobility on the same (100) substrate for both the p- and n-channel types.

There has thus been a demand for a semiconductor device with high mobility in which both p- and n-channel types are formed on the same substrate, and for a manufacturing method thereof.

BRIEF SUMMARY OF THE INVENTION

According to a first aspect of the present disclosure, there is provided a semiconductor device, which includes:

a semiconductor substrate having, on a surface thereof, a (110) surface of $Si_{1-x}Ge_x$ ($0.25 \leq x \leq 0.90$); and an n-channel MISFET and a p-channel MISFET formed on the (110) surface, each MISFET having a source region, a channel region and a drain region, each MISFET having a linear active region which is longer in a [−110] direction than in a [001] direction and which has a facet of a (311) or (111) surface, the source region, the channel region and the drain region being formed in this order or in reverse order in the [−110] direction of the linear active region, the channel region of the n-channel MISFET being formed of Si and having uniaxial tensile strain in the [−110] direction, and the channel region of the p-channel MISFET being formed of $Si_{1-y}Ge_y$ ($x < y \leq 1$) and having uniaxial compressive strain in the [−110] direction.

According to a second aspect of the present disclosure, there is provided a method of manufacturing a semiconductor device, which includes:

preparing a semiconductor substrate having, on a surface thereof, a (110) surface of $Si_{1-x}Ge_x$ ($0.25 \leq x \leq 0.90$);

forming, by a selective epitaxial growth method, a linear semiconductor region on the (110) surface, and providing uniaxial strain in a [−100] direction of the linear semiconductor region, the linear semiconductor region having a composition different from that of the surface of the semiconductor substrate, being longer in the [−110] direction than in a [001] direction and having a facet of a (311) or (111) surface; and forming a source region, a channel region and a drain region in this order or in reverse order in the [−110] direction of the semiconductor substrate.

BRIEF DESCRIPTION OF THE SEVERAL VIEWS OF THE DRAWING

FIG. 1A is a sectional view of a semiconductor device according to a first embodiment;

FIG. 1B is a top view of the semiconductor device according to the first embodiment, the section of which is taken along line 1A-1A is shown in FIG. 1A;

FIGS. 2 and 3 are sectional views for explaining a method of manufacturing the semiconductor device according to the first embodiment;

FIG. 6 is a sectional view of a step following FIGS. 5A and 5B;

FIGS. 7A and 7B are a sectional view and top view of a step following FIG. 6;

FIGS. 8 to 12 are sectional views of steps following FIGS. 7A and 7B;

FIG. 17A is a sectional view of a semiconductor device according to a third embodiment;

FIG. 17B is a top view of the semiconductor device according to the third embodiment, the section of which is taken along line 17A-17A is shown in FIG. 17A;

FIGS. 18A and 18B and FIGS. 19 to 29 are sectional views for explaining stepwise a method of manufacturing the semiconductor device according to the third embodiment;

FIG. 30A is a sectional view of a semiconductor device according to fourth and fifth embodiments;

FIGS. 33A and 33B are a sectional view and top view of a step following FIGS. 32A and 32B;

FIGS. 34A and 34B are a sectional view and top view of a step following FIGS. 33A and 33B;

FIG. 35 is a sectional view of a step following FIGS. 34A and 34B;

FIGS. 36A and 36B, FIGS. 37A and 37B, FIG. 38 and FIGS. 39A and 39B are sectional views and top views showing stepwise steps following FIG. 35; and FIGS. 40 to 45 are sectional views showing stepwise steps following FIGS. 36A and 36B.

DETAILED DESCRIPTION OF THE INVENTION

Figure 3:
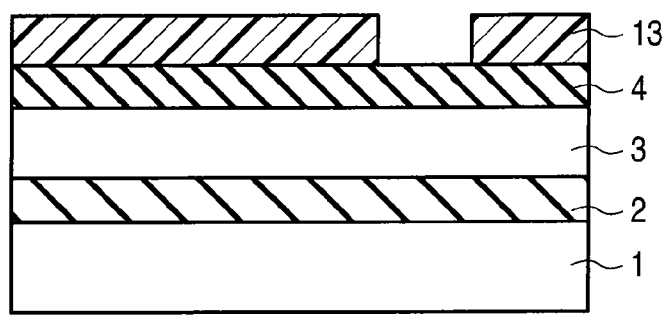

According to embodiments described below, a complementary MISFET is obtained in which a channel having uniaxial strain in an optimal current direction is formed in at least a p-type region and in which channels with high mobility are formed on a (110) surface of the same substrate in both p- and n-type regions.

The embodiments will hereinafter be described referring to the drawings. It should be noted that the drawings are schematic and the relation between the thickness and planar dimensions, the ratio of the thicknesses of layers, etc., are different from real ones. Therefore, specific thickness and dimensions should be judged in consideration of the following description. It should also be noted that the drawings include parts different from each other in dimensions and ratios.

First Embodiment

FIG. 1 shows the configuration of a complementary MISFET according to a first embodiment. FIG. 1A is a sectional view, and FIG. 1B is a top view. A section taken along line 1A-1A in FIG. 1B is shown in FIG. 1A. The complementary MISFET in the first embodiment is provided with channels having uniaxial strain in an optimal current direction in both p- and n-type regions on a silicon-germanium-on-insulator (SGOI) substrate.

In FIG. 1A, a silicon germanium layer (SGOI layer, Ge concentration x [0.25<x<0.9]) 3 is formed on a silicon substrate 1 via a silicon oxide film 2. This configuration is called the SGOI substrate. However, the SGOI substrate may be produced by an oxidative concentration method or by a wafer bonding method. A silicon oxide film 4 is formed on the SGOI layer 3. An Si layer 5 and Ge layer 6 are selectively grown in rectangular openings selectively formed in the silicon oxide film 4. The rectangular openings correspond to 10 in FIG. 1B.

Here, a growth face on the SGOI layer 3 is a (110) surface. On the surface of this surface, the rectangular growth windows (openings) 10 are formed which are long in a [−110] direction and short in a [001] direction perpendicular to the [−110] direction. The short side of the window is about 10 to 30 nm, and its aspect ratio is about 4 to 7. The SGOI layer 3 applies strain to the Si layer 5 and the Ge layer 6. The concentration x of Ge is in the above-mentioned range such that the mobility of a channel through the Si layer 5 and the Ge layer 6 can be improved. The Ge layer 6 may be an $Si_{1-y}Ge_y$ (x<y<1) layer, but is preferably a Ge layer of y=1 from the perspective of mobility improvement. The Ge layer 6 of y=1 is also preferable from the perspective of easiness of selective epitaxial growth.

At the windows, a linear silicon region 5 and a linear germanium region 6 are formed by a selective epitaxial growth method in accordance with, for example, the chemical vapor deposition (CVD) method. The linear silicon region 5 and the linear germanium region 6 will be active regions later, and are grown under conditions where a (311) facet and a (111) facet are formed in regions serving as channels, for example, at 600° C. and 0.1~1 Pa in the case of an Si channel or at 400° C. and 1 Pa in the case of a Ge channel. Thus, a section perpendicular to the [−110] direction is substantially trapezoidal.

At this point, due to the properties specific to the grown layers in this orientation, these grown layers tend to cause more lattice relaxation both elastically and plastically in the [001] direction than in the [−110] direction. In the present embodiment, the channel layer is formed by use of the rectangular window long in the [−110] direction and short in the [001] direction in a situation where an atom easily moves even during growth, that is, in a situation where a facet is easily formed. This makes it possible to promote the effect of the elastic and plastic lattice relaxation in the [001] direction. Thus, the uniaxiality of the lattice relaxation can be improved, and the strain on the surface is released so that a smooth surface is obtained, resulting in improved drive current.

On the other hand, this crystal structure does not easily generate facets and lattice defects along the [−110] direction, and therefore does not cause the reduction of the current driving force. Moreover, this structure is considered the optimum structure of a high-speed complementary MISFET because carrier mobility is the highest when uniaxial compressive strain is contained in the p-channel and uniaxial tensile strain in the n-channels both in the [−110] direction equal to the current direction.

A germanium oxynitride film 7 as a gate insulating film and a silicon oxynitride film 8 are formed on channel regions $5_C$, $6_C$ of the linear silicon region 5 and the linear germanium region 6. Formed on top of these films is a gate electrode 9 traversing the same. In addition, source/drain regions of the silicon region 5 and the germanium region 6 are indicated by $5_S$, $5_D$, $6_S$, $6_D$.

Next, a method of manufacturing the complementary MISFET in the present embodiment is described. First, an SGOI substrate having a (110) surface on its upper surface is prepared as a substrate (hereinafter referred to as an SGOI (110). The SGOI (110) substrate is a stack of a silicon substrate 1, a silicon oxide film 2 and an SGOI (110) layer 3, and is produced by a well-known bonding method or oxidative concentration method. The thickness of the SGOI (110) layer 3 is, for example, 50 nm. Then, as shown in FIG. 2, a silicon oxide film 4 of thickness 30 nm is formed on the SGOI layer 3. In addition, a sign in the right of FIG. 2 indicates that a direction perpendicular to the surface is the [−110] direction.

Figures 4A, 4B:
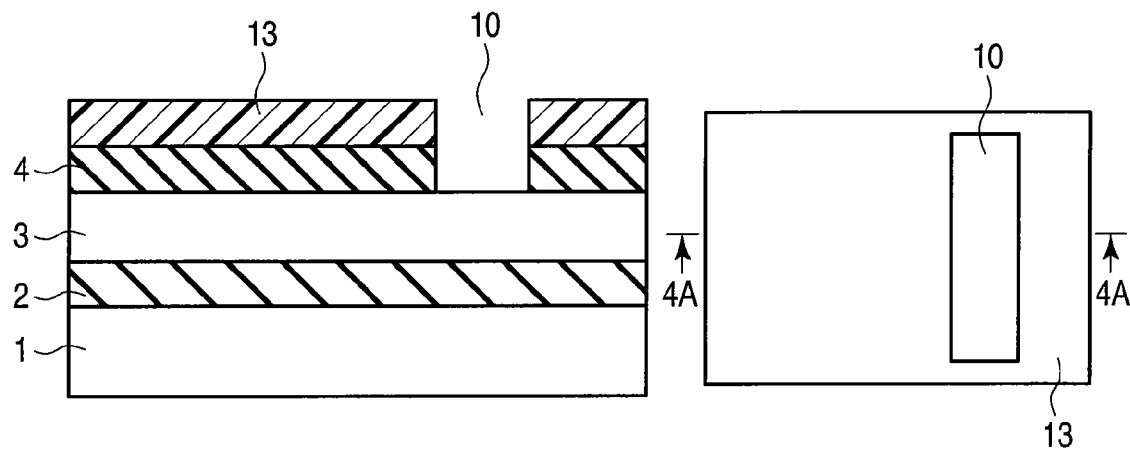
FIGS. 4A and 4B are a sectional view and top view of a step following FIG. 3.

Then, as shown in FIG. 3, a resist mask 13 in which a rectangular window is formed is formed on a silicon oxide film 4. Using this resist mask 13, an opening 10 is formed in the silicon oxide film 4 by anisotropic etching such as chemical dry etching (CDE) or reactive ion etching (RIE), as shown in FIGS. 4A and 4B. This rectangular window is set to be long in the [−110] direction equal to the current direction and to be short in the [001] direction. For example, the short side of this window in the [001] direction is about 10 to 30 nm, and its aspect ratio is about 4 to 7. In the present embodiment, the short side is about 25 nm and the long side in the [−110] direction is 125 nm.

Figures 5A, 5B:
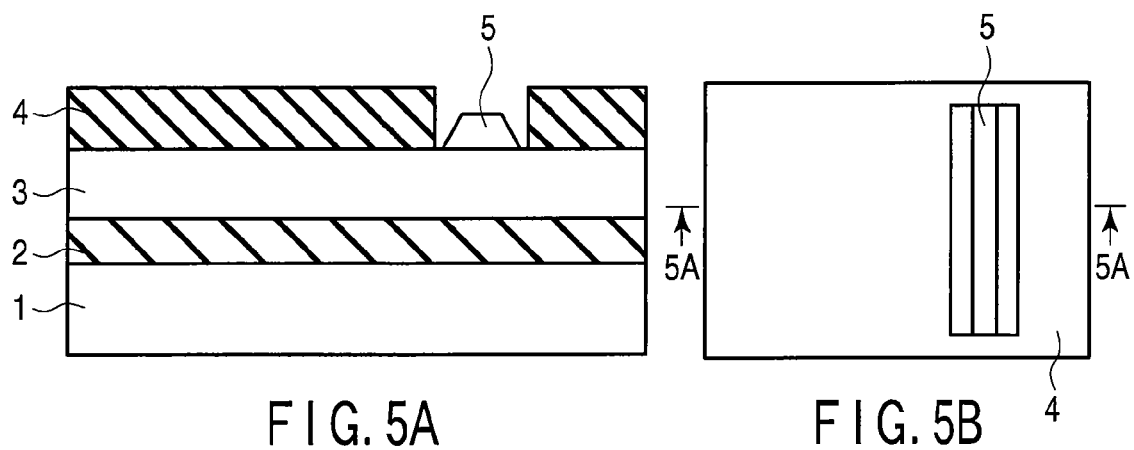
FIGS. 5A and 5B are a sectional view and top view of a step following FIGS. 4A and 4B.

Then, as shown in FIGS. 5A and 5B, a silicon region 5 serving as an active region is formed by a selective epitaxial growth method on the SGOI layer 3 exposed in the opening 10. An n-channel MISFET is formed in this silicon region 5. At this point, a film is formed under growth conditions with high selectivity, that is, under conditions that facilitate the movement of material molecules on the substrate. Thus, it is possible to form a uniaxial strain channel region involving the formation of facets in the (311) surface or (111) surface. Here, a film of thickness 20 nm is grown at a growth temperature of about 600° C. and a growth pressure of about 0.1 Pa by the CVD method using dichlorosilane or a gaseous mixture of monosilane and chlorine.

Then, as shown in FIG. 6, an Si oxide film obtained by CVD of tetraethoxysilane (TEOS) or a low-temperature oxide (LTO) is used to form a protective film 14 of thickness 50 nm over the entire surface. On top of the protective film 14, a resist mask 15a having an opening corresponding to the channel region of the silicon region 5 is formed. N-type impurities (such as As, P and Sb) are ion-implanted as a channel dopant with a concentration of about $1\times10^{15}/cm^3$ via the resist mask 15a.

Then, as shown in FIGS. 7A and 7B, a resist mask 16 having an opening 17 for the formation of source/drain regions are redeposited, so that n-type impurities (such as As, P and Sb) are ion-implanted with a concentration of about $1\times10^{20}/cm^3$. As shown in FIG. 8, after the resist mask 16 has been removed, rapid thermal annealing (RTA) is carried out as activation annealing at 900° C. for about ten seconds. Consequently, source/drain regions $5_S$, $5_D$ are formed.

Then, as shown in FIG. 9, a resist mask 18 having an opening for the formation of a p-type region is formed on the protective film 14 made of TEOS or LTO. The size of the rectangular opening is similar to that in the n-type region, the short side being about 25 nm and the long side being 125 nm.

Using this resist mask 18, the protective film 14 and the silicon oxide film 4 are anisotropically etched to provide an opening 19 so that the surface of the SGOI layer 3 is exposed, as shown in FIG. 10. On the exposed SGOI layer 3, a p-type region is formed by Ge or by SiGe having a higher Ge composition than the SGOI layer serving as a growth substrate, as shown in FIG. 11.

More specifically, as in the growth of silicon in the n-type region, a film is formed under growth conditions with high selectivity, that is, under conditions that facilitate the movement of material molecules on the substrate, such that it is possible to form a uniaxial strain channel region involving the formation of facets in the (311) surface or (111) surface. Here, a p-type region of thickness 20 nm is formed by the CVD method (at a growth temperature of about 300 to 400° C. and a growth pressure of about 0.1 to 1 Pa) using monogermane.

Figure 12:
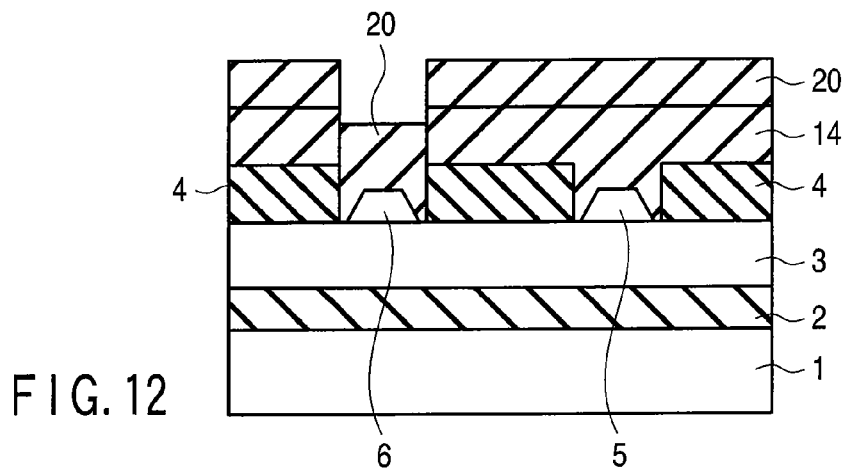

Then, as shown in FIG. 12, a protective film 20 made of TEOS or LTO is deposited over the entire surface (integrated on the protective film 14), and p-type impurities (such as B and Ga) are ion-implanted as a channel dopant into the channel region of the p-type region with a concentration of about $1\times10^{15}/cm^3$.

Figures 13A, 13B:
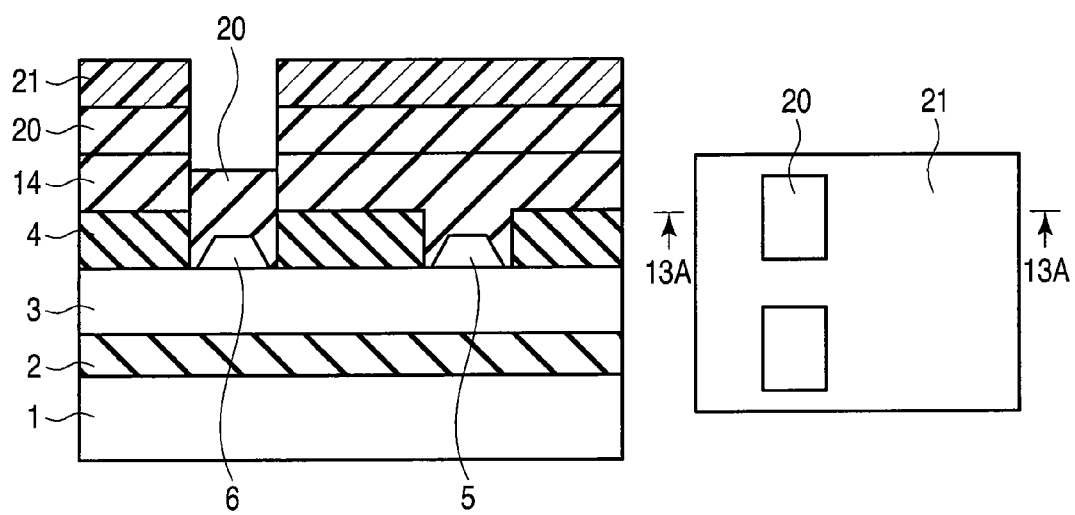
FIGS. 13A and 13B are a sectional view and top view of a step following FIG. 12.
Figures 14A, 14B:
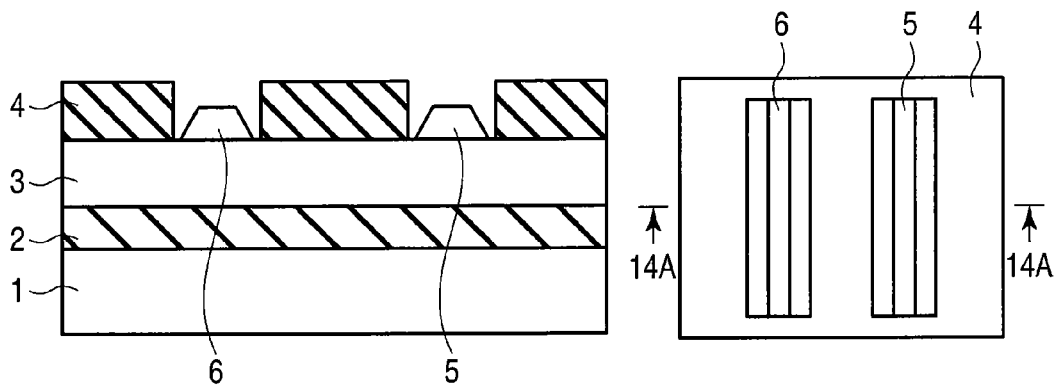
FIGS. 14A and 14B are a sectional view and top view of a step following FIGS. 13A and 13B.

Then, as shown in FIGS. 13A and 13B, a resist mask 21 having an opening 20 for the formation of source/drain regions are deposited, so that p-type impurities (such as B and Ga) are ion-implanted with a concentration of about $1\times10^{20}/cm^3$. Then, as shown in FIGS. 14A and 14B, after the resist mask 21 has been removed, activation annealing is carried out at 350 to 400° C. for about 20 minutes to remove the protective film 14. Consequently, source/drain regions $6_S$, $6_D$ are formed.

Figure 15:
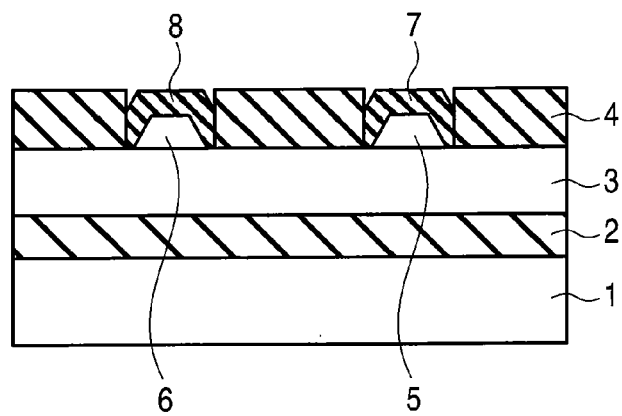
FIG. 15 is a sectional view of a step following FIGS. 14A and 14B.

Then, as shown in FIG. 15, the channel region $5_C$ of the silicon region 5 and the channel region $6_C$ of the germanium region 6 are oxynitrided to form an SiON film 7 and a GeON film 8 as gate insulating films. The gate insulating films are not limited to these materials, and it is also possible to use, for example, a deposited silicon oxide film or a deposited silicon oxynitride film, or a high-k material such as HfSiON, $HfO_2$, LaAlO, $ZrO_2$, $La_2Hf_2O_7$ or ZrSiON.

Then, a polysilicon gate, a silicide gate such as $NiSi_x$ or PtSi, or a metal gate such as TiN or TaC is formed as a gate electrode 9, such that the complementary MISFET shown in FIGS. 1A and 1B is obtained.

As described above, according to the first embodiment, a complementary MISFET is obtained in which p-channel having uniaxial compressive strain and n-channel having uniaxial tensile strain in optimal current directions are formed on the same (110) substrate.

Second Embodiment

Figure 16A:
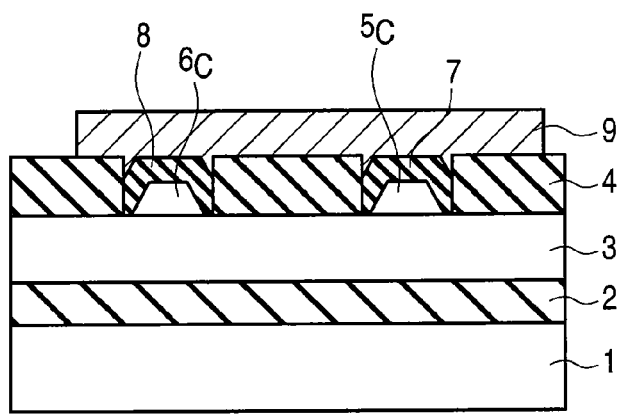
FIG. 16A is a sectional view of a semiconductor device according to a second embodiment.
Figure 16B:
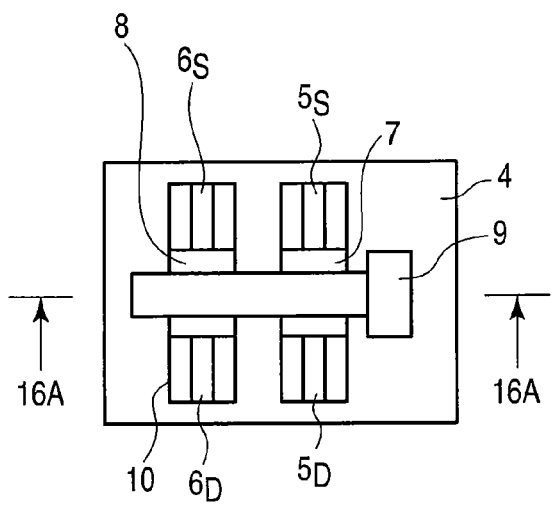
FIG. 16B is a top view of the semiconductor device according to the second embodiment, the section of which is taken along line 16A-16A is shown in FIG. 16A.

FIGS. 16A and 16B show the configuration of a complementary MISFET according to a second embodiment. In the second embodiment, metal source/drain regions are formed by silicidation and germanidation as compared with the source/drain regions which are formed by impurity implantation in the first embodiment. That is, FIG. 16A shows a section through a channel region and is therefore the same as FIG. 1A, but FIG. 16B is different in $5_S$, $5_D$, $6_S$, $6_D$. Other parts are the same as those in the first embodiment, and are therefore provided with the same numbers and not described in detail.

Next, a method of manufacturing the semiconductor device according to the second embodiment is described. The steps from FIG. 2 to FIG. 6 in the first embodiment are carried out as in the first embodiment. The step of forming windows in the source/drain regions in FIGS. 7A and 7B is not carried out here, and the steps from FIGS. 8 to 12 are carried forward. In the following step in FIGS. 13A and 13B, windows (a window in a silicon region is not shown) open in the source/drain regions of both a silicon region 5 and a germanium region 6 are formed by dry etching.

Then, Ni is deposited in the windows by a sputter method, and silicidated to produce NiSix (1<x<2) in source/drain regions $5_S$, $5_D$ of an n-channel MIS region. Further, in a p-channel MIS region, NiGex (1<x<2) is produced by germanidation in source/drain regions $6_S$, $6_D$. As a result, the metal source/drain regions are formed. The temperature of the silicidation or germanidation is about 350 to 400° C.

Subsequently, a protective film 14 is removed, and the steps in and after FIG. 15 in the first embodiment are carried out in the same manner, thereby obtaining a semiconductor device shown in FIGS. 16A and 16B.

As described above, according to the second embodiment, a complementary MISFET is also obtained in which channels having uniaxial strain in optimal current directions are formed on the same (110) substrate in both n- and p-type regions.

Third Embodiment

FIGS. 17A and 17B show the configuration of a complementary MISFET according to a third embodiment. In the drawings, 22, 23 denote rectangular fine silicon regions, $22_C$, $23_C$ denote channel regions, $22_S$, $23_S$, $22_D$, $23_D$ denote source/drain regions, 25 denotes a gate insulating film, and 26 denotes a gate electrode.

However, FIG. 17B omits the insulating film 25 that is shown in FIG. 17A, in order to avoid complication of the drawing. Actually, the insulating film 25 is formed under the gate electrode 26 and over the entire surface of a substrate. Other parts are the same as those in the first and second embodiments, and the same parts as those in FIGS. 1A and 1B or 16A and 16B are therefore provided with the same numbers and not described in detail.

The third embodiment is a modification of the first and second embodiments, and is changed in channel structure obtained by selective epitaxial growth. That is, growth conditions are changed during the growth of the fine linear silicon region 23 to cause the lateral growth or epitaxial lateral overgrowth (ELO) of the silicon region 23, thereby producing the channel regions $22_C$, $23_C$ having flat surfaces and having uniaxial strain. The lateral growth conditions can be obtained by changing the growth conditions with strong selectivity to conditions with less selectivity. In general, the ELO is enabled by changing the growth conditions to conditions with a lower temperature and high pressure. As a result of the lateral growth, the section of the fine linear silicon region 23 perpendicular to the [−110] direction is in a T-shape having a flat upper surface wider than in its lower surface.

Next, a method of manufacturing the complementary MISFET in the present embodiment is described. First, the steps from FIG. 2 to FIGS. 5A and 5B in the first embodiment are carried out as in the first embodiment. That is, the resist 13 in FIG. 4A is removed, and an Si region for an n-channel is grown at the window, as shown in FIGS. 5A and 5B. More specifically, a linear silicon region (6) is grown by a selective epitaxial growth method such as CVD under conditions where a (311) facet and a (111) facet can be formed, for example, at 600° C. and 1 Pa.

Then, as shown in FIGS. 18A and 18B, the growth conditions are changed to a lateral mode, so that the Si region for the n-channel is grown over an insulating film to form a flat n-channel Si region 22. More specifically, monosilane or disilane alone is used as a source gas, and the pressure is increased to about 20 to 100 Pa. In the case of rapid thermal CVD (RTCVD), the temperature can be rapidly changed, so that the growth temperature is dropped to about 500 to 550° C.

Figure 19:
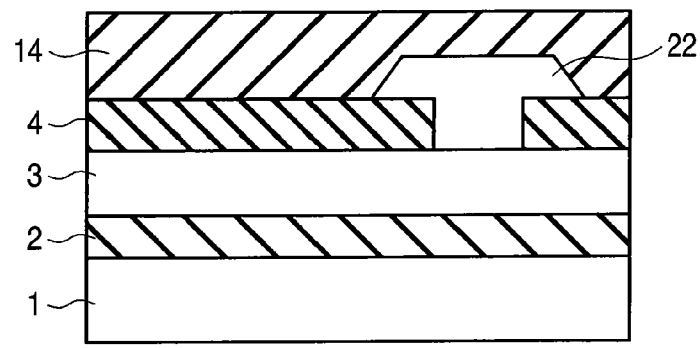
Figure 20:
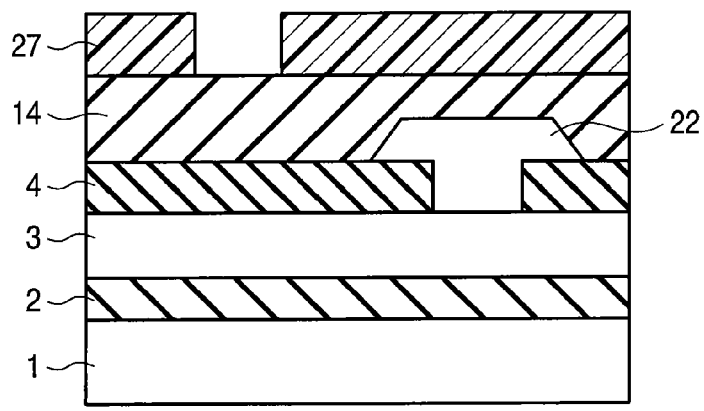
Figure 21:
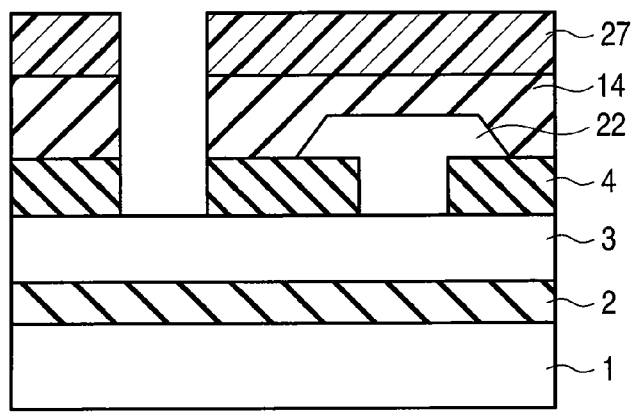

Then, as shown in FIG. 19, a protective film 14 made of, for example, TEOS or LTO is formed to a thickness of 100 nm over the entire surface, and is channel-doped with n-type impurities. The impurities used for doping are annealed for activation. Then, as shown in FIG. 20, a resist mask 27 having a window for the formation of a p-channel region is formed. Using this resist mask 27, a window is formed in the protective film 14 and a silicon oxide film 4 by anisotropic etching such as CDE or RIE, as shown in FIG. 21.

Figure 22:
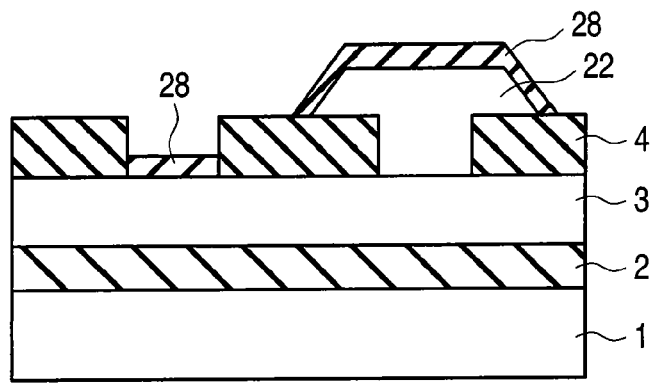
Figure 23:
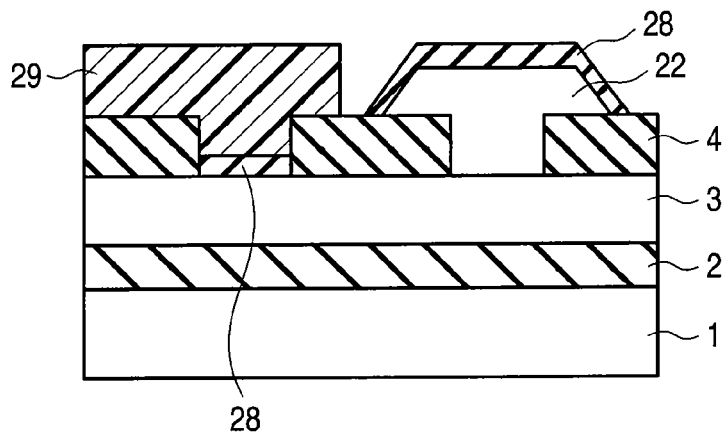
Figure 24:
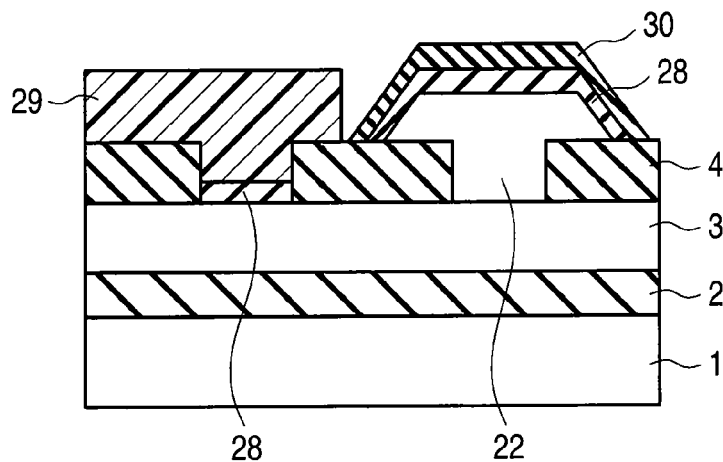

Then, the resist mask 27 and the protective film 14 are removed, and a thermally-oxidized film 28 having a thickness of several nanometers is formed as shown in FIG. 22. Then, as shown in FIG. 23, a resist 29 for masking the p-channel region is formed. Then, as shown in FIG. 24, a silicon nitride film 30 of thickness 20 nm for protecting the n-channel region is formed.

Then, as shown in FIG. 25, the resist 29 and the thermally-oxidized film 28 thereunder are removed by, for example, etching, to expose an SGOI layer 3. Further, similarly to the formation of the n-channel region, a p-channel region is formed using selective epitaxial growth and lateral growth.

More specifically, during the selective epitaxial growth, the germanium region 23 is grown by the CVD method using monogermane at a growth temperature of about 300 to 400° C. and a growth pressure of about 0.1 to 1 Pa, as in the first embodiment. In the case of changing to the lateral growth, the pressure is increased to about 100 to 1000 Pa.

Here, in the flat channel region formed by the lateral growth as well, growth in the [−110] direction is extremely slow as compared with growth in [001] direction, and the uniaxial strain in a region produced by the selective epitaxial growth in a lower part is maintained. Thus, this region has the properties of being more difficult to relax both elastically and plastically in the [−110] direction than in the [001] direction.

Then, as shown in FIG. 27, a protective film 31 for the p-channel is formed by, for example, TEOS or LTO. After doping of the p-channel, activation annealing is carried out, and the protective film 31, the silicon nitride film 30 and the silicon oxide film 28 are removed by, for example, etching.

Then, as shown in FIG. 29, a shallow trench isolation (STI) 32 is formed at the interface between the p-channel region and the n-channel region, so that the p- and n-channel regions are separated from each other. Further, the gate insulating film 25 is formed on this flat channel region by, for example, oxidation, nitriding or oxynitriding or by, for example, a high-k material, and the gate electrode 26 is formed. Then, the metal source/drain regions $22_S$, $22_D$, $23_S$, $23_D$ are formed by silicidation and germanidation as in the second embodiment. Subsequently, the step of forming a normal CMIS is carried out to form a complementary MISFET.

As described above, according to the third embodiment, a complementary MISFET is also obtained in which channels having uniaxial strain in optimal current directions are formed on the same (110) substrate in both n- and p-type regions. In addition, the surfaces of the source/drain regions are flat, so that the formation of an upper layer in, for example, a wiring step is facilitated.

Fourth Embodiment

Figure 30B:
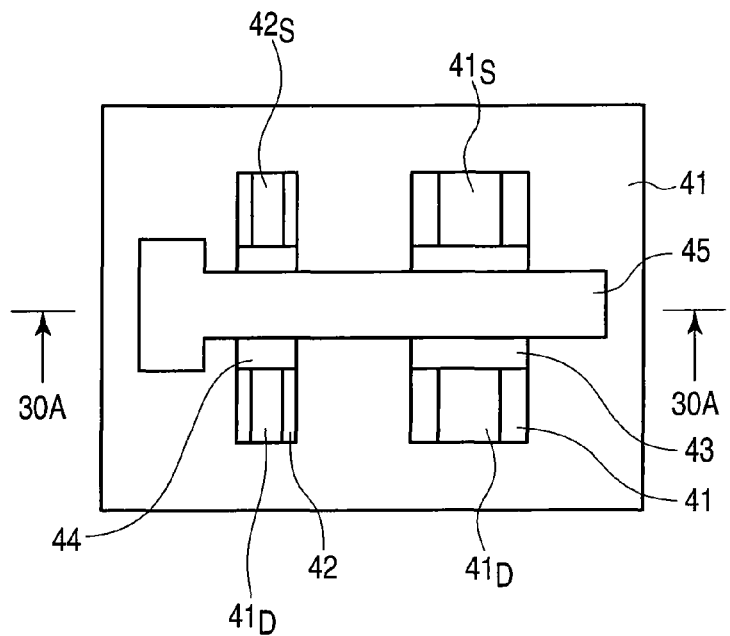
FIG. 30B is a top view of the semiconductor device according to the fourth and fifth embodiments, the section of which is taken along line 30A-30A is shown in FIG. 30A.
Figure 44:
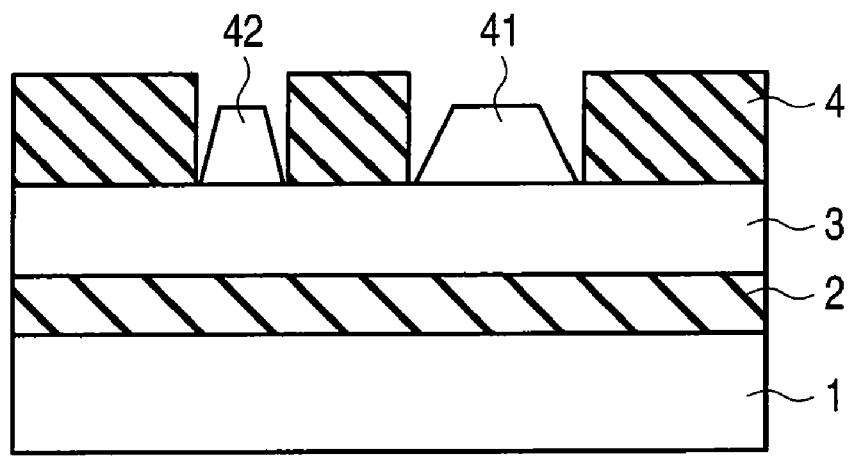

FIGS. 30A and 30B show the configuration of a complementary MISFET according to a fourth embodiment. In the complementary MISFET shown in the first embodiment, the SGOI layer 3 (Ge concentration x [0≦x≦1]) is provided, and p- and n-channels are formed of compound semiconductors having a lattice constant higher than that of the SGOI layer 3, such that a further improvement in mobility can be expected. Such a configuration is shown in the fourth embodiment. In FIGS. 30A and 30B, 44 denotes an n-channel compound semiconductor region, 45 denotes a p-channel compound semiconductor region, 43, 44 denote gate insulating films, and 45 denotes a gate electrode. Other parts are the same as those in the first embodiment, and are therefore provided with the same numbers and not described in detail.

As the compound semiconductors, indium antimonide (InSb) is used in the present embodiment. It is, however, also possible to use, for example, GaAs, InP, InAs or AlAs, or ternary systems of these substances such as AlGaAs and InAlAs. By the application of uniaxial compressive strain to the compound semiconductor region, hole mobility can be improved, that is, a p-channel with high mobility can be formed. If an isotropic relaxation region is separately formed, electron mobility can be improved, that is, an n-channel with high mobility can be formed.

In addition, the relation between the degrees of lattice constants is roughly as follows:

Si<Ge to GaAs<(AlAs,InSb,InP,InAs)

Therefore, the use of a group III-V compound having a lattice constant higher than that of the SGOI layer 3 makes it possible not only to improve mobility owing to the characteristics of the material but also to apply strain sufficient to improve the mobility in the p-channel.

Figure 31:
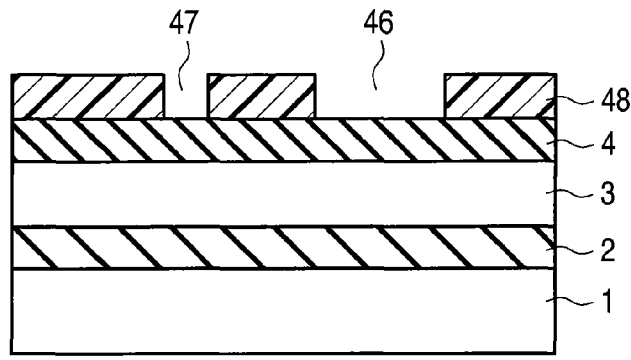
FIG. 31 is a sectional views for explaining a method of manufacturing the semiconductor device according to the fourth embodiment.

Next, a method of manufacturing the complementary MISFET in the present embodiment is described. First, a silicon oxide film 4 is formed on an SGOI (110) as in FIG. 2 in the first embodiment. Then, as shown in FIG. 31, a resist mask 48 having a window 46 for forming an n-channel semiconductor region and a window 47 for forming a p-channel semiconductor region is formed on the silicon oxide film 4.

Here, the window 46 for the n-channel region is formed as a rectangular or square window having, for example, a short side of 50 nm and an aspect ratio of about 1 to 2. The window 47 for the p-channel region is formed as a rectangular window long in the [−110] direction and short in the [001] direction as in the first embodiment, for example, as a window having a short side of 25 nm and a long side of 125 nm. The aspect ratio of the window 47 for the p-channel region is higher than that of the window 46 for the n-channel region.

Figures 32A, 32B:
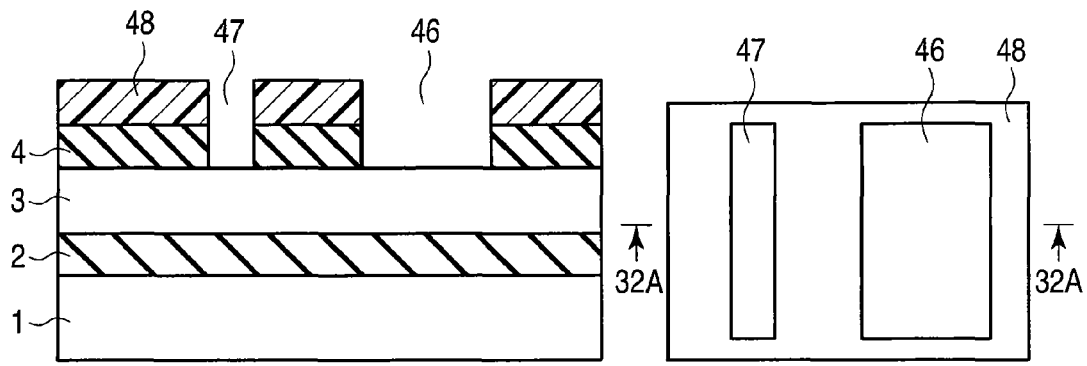
FIGS. 32A and 32B are a sectional view and top view of a step following FIG. 31.

Then, as shown in FIGS. 32A and 32B, using the resist mask 48, the silicon oxide film 4 is etched by anisotropic etching such as CDE or RIE to expose the surface of the SGOI layer 3.

Then, as shown in FIGS. 33A and 33B, as a region of a p-channel window 42, a channel region having uniaxial compressive strain in the [−110] direction equal to the current direction is grown by the metal organic CVD (MOCVD) method under growth conditions of 300 to 400° C. and about 3000 Pa. On the other hand, for an n-channel window 41, a channel region in which isotopic lattice relaxation is caused by the effective use of plastic deformation at a growth interface is formed by a selective epitaxial growth method simultaneously with the formation of the p-channel.

If these channel regions mentioned above are formed under growth conditions with high selectivity, that is, under conditions that facilitate the movement of material molecules on the substrate, facets are formed in the (311) surface or (111) surface. At this point, a channel region having uniaxial compressive strain is formed in the p-type region. Subsequently, channel doping and activation annealing are carried out.

Then, as shown in FIGS. 34A and 34B, the insulating films 43, 44 are formed by, for example, a deposited silicon oxide film or a deposited silicon oxynitride film, or a high-k material such as HfSiON, HfO$_2$, LaAlO, ZrO$_2$, La$_2$Hf$_2$O$_7$ and ZrSiON.

Then, the metal gate electrode 45 of, for example, TiN or TaC is formed. Further, for example, Ni, Pt, Au, AuGe and Ti are deposited on source/drain regions and thermally reacted, such that source/drain regions $41_S$, $41_D$, $42_S$, $42_D$ are formed by an alloy metal showing ohmic properties to compound channel regions $41_C$, $42_C$. Thus, the complementary MISFET shown in FIGS. 30A and 30B is obtained.

As described above, in the fourth embodiment, the compound semiconductors are used, such that a channel having uniaxial strain in an optimal current direction is formed in the p-type region while a channel having isotopically relaxed strain is formed in the n-type region. Thus, a complementary MISFET having channels with high mobility in both n- and p-type regions is obtained.

Fifth Embodiment

A fifth embodiment and the fourth embodiment are different in manufacturing method but are the same in configuration except that the concentration x of Ge in an SGOI layer 3 is $0 \leq x \leq 0.90$ and except that a p-channel semiconductor region is formed of Ge. In the fourth embodiment, the p- and n-channel semiconductor regions are selectively grown at the same time. In contrast, in the fifth embodiment, a p-channel semiconductor region is formed first, and an n-channel semiconductor region is then formed. The structure of a completed product is the same as that in the fourth embodiment. Thus, FIGS. 30A and 30B are incorporated, and the structure is not described in detail.

Next, a manufacturing method in the present embodiment is described. First, a silicon oxide film 4 is formed on an SGOI substrate as in FIG. 2 in the first embodiment. Then, as shown in FIG. 35, a resist mask 50 having a window 49 for a p-channel semiconductor region is formed on the silicon oxide film 4.

Here, the window 49 for the p-channel region is formed as a rectangular window long in the [−110] direction and short in the [001] direction as in the first embodiment, for example, as a window having a short side of 25 nm and a long side of 125 nm.

Figure 36A:
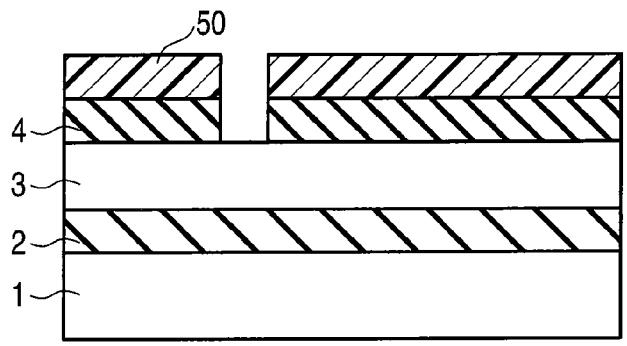
Figure 36B:
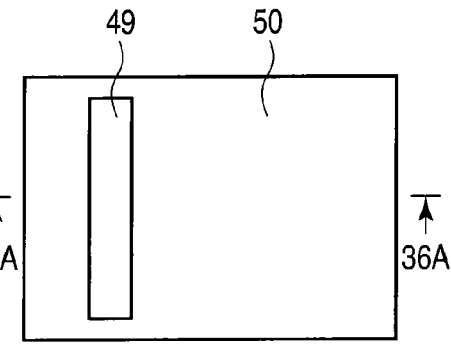

Then, as shown in FIGS. 36A and 36B, using the resist mask 50, the silicon oxide film 4 is etched by anisotropic etching such as CDE or RIE to expose the surface of the SGOI layer 3.

Figure 37A:
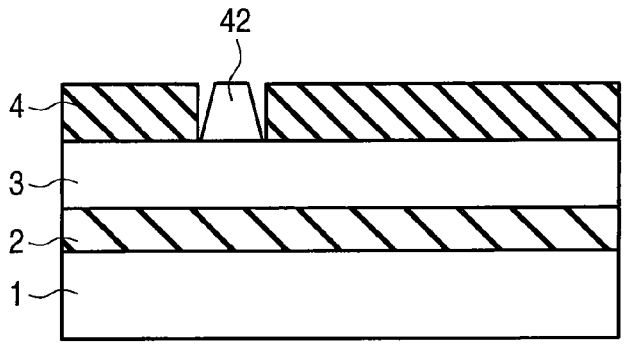
Figure 37B:
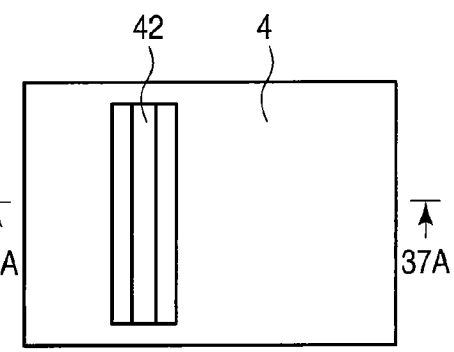

Then, as shown in FIGS. 37A and 37B, as the window 49 for the p-channel region, a channel region having uniaxial compressive strain in the [−110] direction equal to the current direction is grown by the CVD method under growth conditions of 300 to 400° C. and about 1 Pa. At this point, a film is formed under growth conditions with high selectivity, that is, under conditions that facilitate the movement of material molecules on the substrate, such that facets are formed in the (311) surface or (111) surface. Moreover, a channel region having uniaxial compressive strain is formed in the p-type region. Subsequently, channel doping and activation annealing are carried out as described below.

Figure 38:
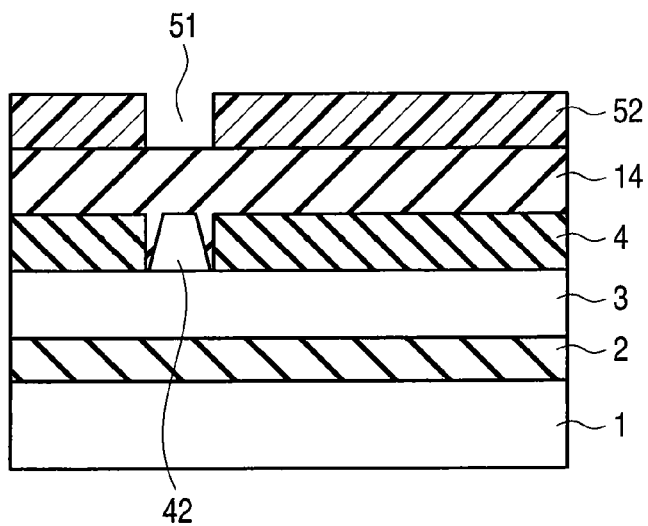

As shown in FIG. 38, a protective film 14 made of, for example, TEOS or LTO is deposited over the entire surface, on which a resist mask 52 having a window 51 for p-channel ion implantation is formed. Then, using the resist mask 52, p-channel ions are implanted with an impurity concentration of about $1 \times 10^{15}/cm^3$.

Then, as shown in FIGS. 39A and 39B, a resist mask 55 having a source region window 53 and a drain region window 54 is formed. Using the resist mask 55, ion implantation for the formation of source/drain regions is carried out with a concentration of about $1 \times 10^{20}/cm^3$. Then, the resist 55 is released, and activation annealing is carried out at 400° C. for about ten minutes.

Then, as shown in FIG. 40, a resist mask 58 having a window 57 for the formation of an n-type semiconductor region is formed on the protective film 14. The window 57 for the n-channel region is in a rectangular or square shape having, for example, a short side of 50 nm and an aspect ratio of about 1 to 2.

Then, as shown in FIG. 41, using the resist mask 48, the silicon oxide film 4 is etched by anisotropic etching such as CDE or RIE to expose the surface of the SGOI layer 3.

Then, as shown in FIG. 42, a channel region in which isotopic lattice relaxation is caused by the effective use of plastic deformation at a growth interface is formed in an n-channel window 56 by, for example, the MOCVD method in accordance with a selective epitaxial growth method under growth conditions of 300 to 400° C. and about 3000 Pa. At this point, a film is formed under growth conditions with high selectivity, that is, under conditions that facilitate the movement of material molecules on the substrate, such that facets are formed in the (311) surface or (111) surface.

Then, as shown in FIG. 43, a protective film 58 made of, for example, TEOS is deposited for the doping of the n-channel, and n-type impurities are implanted over the protective film 58 with a concentration of about $1 \times 10^{15}/cm^3$, and then activation annealing is carried out. After the activation annealing, the protective films 58, 14 are released, thus obtaining the structure shown in FIG. 44.

Figure 45:
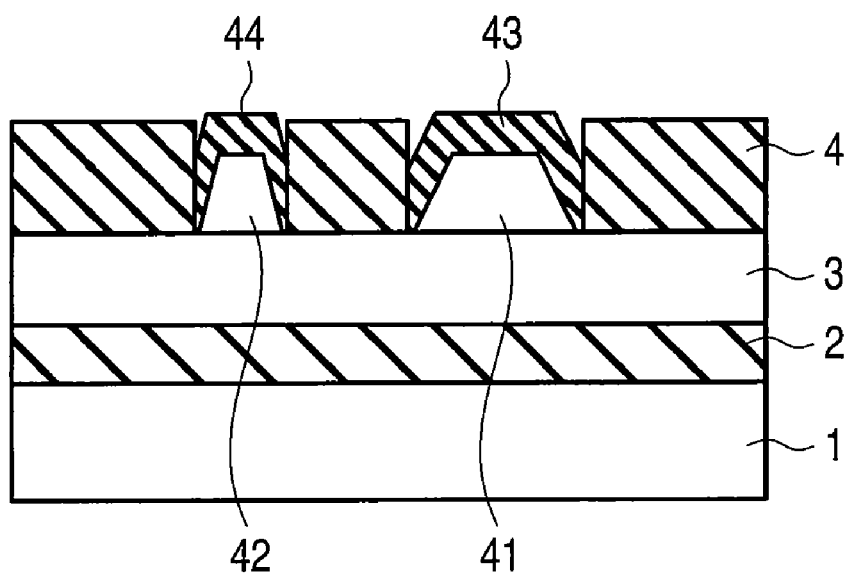

Then, as shown in FIG. 45, insulating films 43, 44 are formed by, for example, a deposited silicon oxide film or a deposited silicon oxynitride film, or a high-k material such as HfSiON, $HfO_2$, LaAlO, $ZrO_2$, $La_2Hf_2O_7$ or ZrSiON.

Then, as in the fourth embodiment, the metal gate electrode 45 of, for example, TiN or TaC is formed. Further, source/drain regions $41_S$, $41_D$, $42_S$, $42_D$ are formed by an alloy metal showing ohmic properties to compound channel regions $41_C$, $42_C$. Thus, the complementary MISFET shown in FIGS. 30A and 30B is obtained.

As described above, in the fifth embodiment, the compound semiconductors are used in the n-type region, and Ge is used in the p-type region. Thus, a channel having uniaxial strain in an optimal current direction is formed, and in the n-type region, a channel having isotopically relaxed strain is formed. Consequently, a complementary MISFET having channels with high mobility in both n- and p-type regions is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having, on a surface thereof, a (110) surface of $Si_{1-x}Ge_x$ ($0 \leq x \leq 0.90$); and
   an n-channel MISFET and a p-channel MISFET formed on the (110) surface, each MISFET having a source region, a channel region and a drain region,
   the n-channel MISFET having an active region containing a facet of a (311) or (111) surface, and the source region, the channel region and the drain region being formed in this order or in reverse order in a [−110] direction of the active region,
   the p-channel MISFET having a linear active region which is longer in a [−110] direction than in a [001] direction and which has a facet of a (311) or (111) surface, and the source region, the channel region and the drain region being formed in this order or in reverse order in a [−110] direction of the active region,
   the channel region of the n-channel MISFET being formed of a group III-V compound,
   the channel region of the p-channel MISFET being formed of $Si_{1-y}Ge_y$ ($x<y \leq 1$), and
   the channel region of the n-channel MISFET having isotopically relaxed strain, and the channel region of the p-channel MISFET having uniaxial compressive strain in the [−110] direction of the active region.

2. The semiconductor device according to claim 1, wherein a section of the active region perpendicular to the [−110] direction is trapezoidal.

3. The semiconductor device according to claim 1, wherein the semiconductor substrate includes a silicon substrate, a silicon oxide film formed on the silicon substrate, and an $Si_{1-x}Ge_x$ ($0 \leq x \leq 0.09$) layer formed on the silicon oxide film.

* * * * *